United States Patent [19]

White

[11] 4,272,765
[45] Jun. 9, 1981

[54] MICROWAVE LEAKAGE DETECTORS

[76] Inventor: Geoffrey T. White, 2/16 Fordholm Rd., Hawthorn, 3122, Victoria, Australia

[21] Appl. No.: 33,094

[22] Filed: Apr. 25, 1979

[30] Foreign Application Priority Data

May 5, 1978 [AU] Australia .............................. PD4309
Jul. 3, 1978 [AU] Australia .............................. PD4927
Jul. 24, 1978 [AU] Australia .............................. PD5197

[51] Int. Cl.$^3$ ............................................. G08B 21/00
[52] U.S. Cl. ..................................... 340/600; 324/74; 324/95; 340/693
[58] Field of Search ............... 340/600, 515, 514, 693; 324/95, 74; 343/703; 325/363, 67, 364; 455/226, 229, 347

[56] References Cited

U.S. PATENT DOCUMENTS 4,032,910  6/1977  Hollway et al. ...................... 340/600

Primary Examiner—Glen R. Swann, III
Attorney, Agent, or Firm—Scully, Scott, Murphy & Presser

[57] ABSTRACT

This invention relates to a microwave leakage detector of the kind suitable for use in a domestic environment for testing leakage from appliances such as microwave ovens by moving the detector along joins or seals of the appliance. The circuitry of the detector is generally known per se. In order to facilitate testing of the detector in the domestic environment the circuitry and associated dipoles are fully encased in a solid block of material in a container having a head portion for accommodating the circuitry and a handle for convenience in use. The container is a clear plastics material enabling a visual warning device associated with said circuitry to be viewed externally and the container has a specific gravity greater than that of water whereby said device is adapted to sink when placed in water. Thus testing of the detector may be readily effected by placing it in a container of water within an oven such that the warning device may be viewed externally of the oven. The water absorbs high levels of radiation which would otherwise destroy the circuitry. By moulding the dipoles integrally in a solid block their resonant frequency is altered and thus the length of the dipoles and consequently the size of the detector is reduced. A method of constructing a detector is also claimed.

7 Claims, 5 Drawing Figures

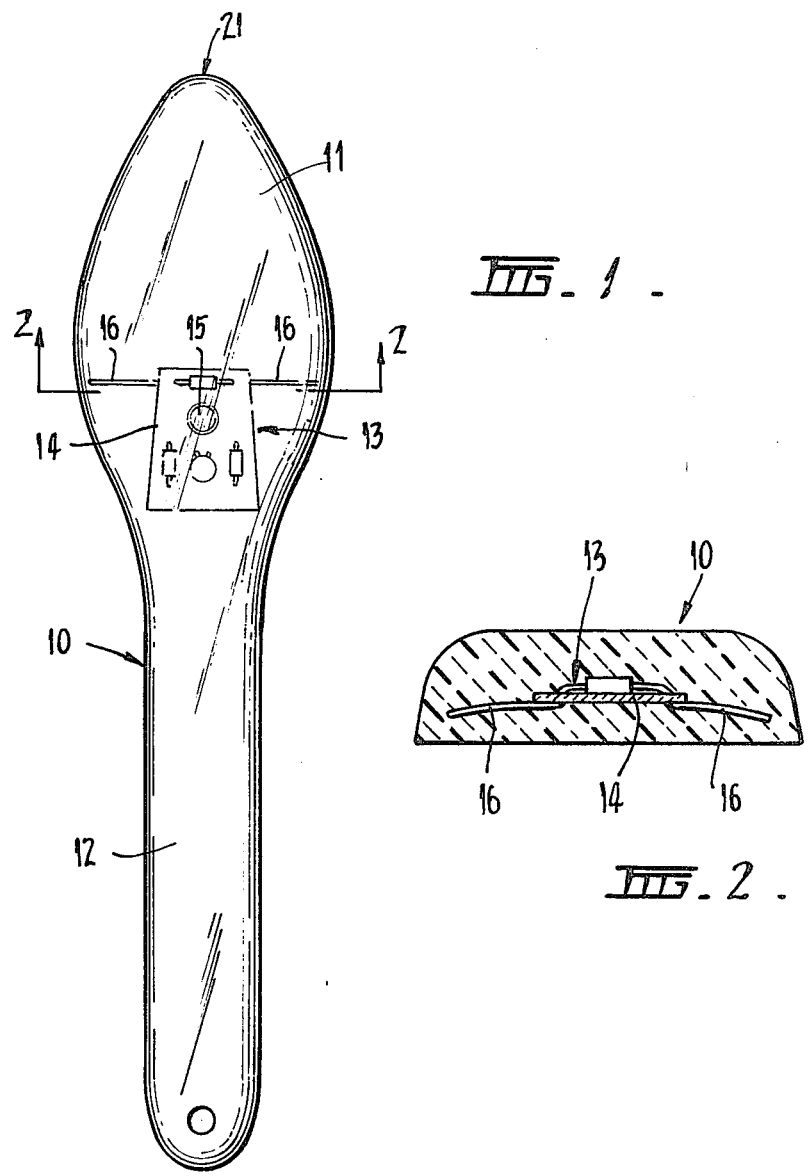

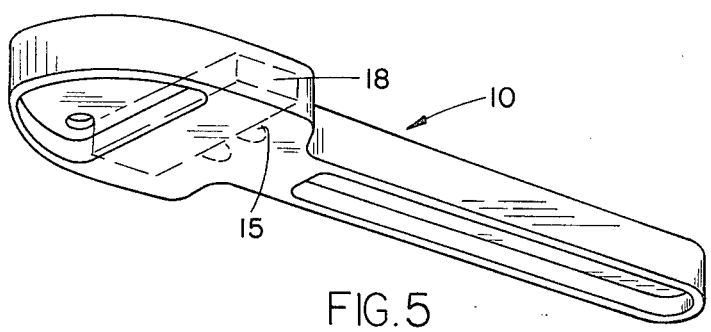
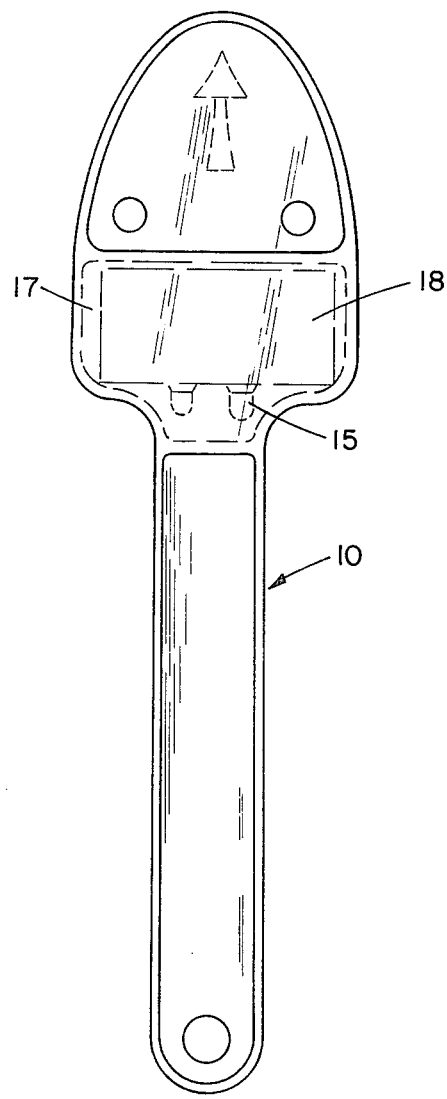
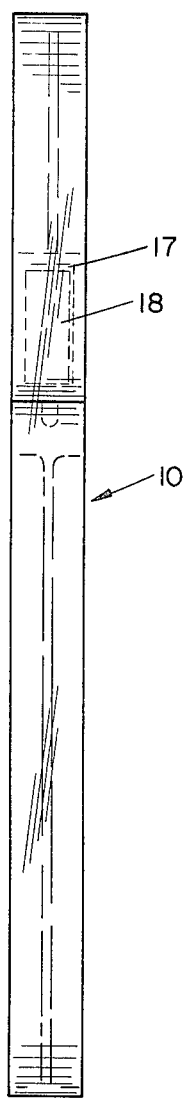

MICROWAVE LEAKAGE DETECTORS

BACKGROUND OF THE INVENTION

1. Field of the Invention

The present invention relates to improvements in microwave leakage detectors and in particular to an improved arrangement for containing such apparatus.

2. Discussion of the Prior Art

One form of known microwave detector is described in U.S. Pat. No. 4,032,910 and is suitable for domestic use in determining, for example, when the leakage from a microwave oven exceeds a predetermined maximum level. The detector described in U.S. Pat. No. 4,032,910 comprises electrical circuitry mounted on a board and adapted to illuminate an associated light emitting diode (LED) when the level of radiated energy in the vicinity of the detector exceeds said predetermined level. In practice the known arrangement has been sealed within a generally hollow plastic container which also accommodates dipoles (aerials) for receiving the wave propagated signal and providing an input to the circuitry.

A problem arises with the above described arrangement in that there is no simple way for the user to test the detector, particularly in the domestic environment, and thus the user may be completely unaware that the detector is not functioning properly. This could result in dangerous levels not being detected. This problem results from the fact that circuitry designed to detect relatively low levels of such energy cannot withstand a burst of high microwave energy as would be experienced inside such an oven. Thus the user cannot place the detector inside the oven for test purposes as it would be destroyed and tests can only be conducted with laboratory type equipment.

SUMMARY OF THE INVENTION

It is thus an object of this invention to provide an improved container or mounting arrangement for encasing a microwave or like detector whereby the aforementioned problem is avoided.

Accordingly the invention provides a microwave detector arrangement comprising electrical circuitry having one or more dipoles connected thereto for receiving wave propagated electromagnetic energy such as microwave energy and providing a signal to said electrical circuitry related to the level of said energy, said circuitry being adapted to operate an associated visual warning device when said level exceeds a predetermined maximum level, said circuitry being fully encased in a substantially solid block of material in a manner whereby said warning device is externally visible and said block having a specific gravity greater than that of water such that said arrangement is caused to sink when placed in water.

In another aspect the invention provides a method of producing a microwave detector arrangement comprising the steps of forming an electrical circuit adapted to receive a signal from associated dipole or dipoles connected thereto in response to said dipole/s receiving wave propagated electromagnetic energy, said circuit being connected to operate an associated visual warning device when the level of said energy exceeds a predetermined maximum level, moulding said circuit within a solid block, forming a container for said block, said container comprising a substantially solid body formed by a moulding process and having a cavity therein to receive said solid block including said dipole/s, placing said solid block snugly within said cavity, placing a cover over said cavity and welding said cover to said body so as to fully enclose said solid block within said cavity in a manner whereby said visual warning device is visible externally of said body, said arrangement having a specific gravity greater than that of water whereby it is caused to sink when placed in water.

It should be appreciated that the detector arrangement according to this invention, by being arranged to sink when placed in water, facilitates simple testing of the detector within the domestic environment. In order to test the detector it may be placed in a high radiation field within a container of water or other suitable liquid allowing the lamp to be viewed from outside the field. In the case of a microwave oven, for example, the user may place the detector within a transparent container of water inside the oven and view the lamp from outside. The water acts as an absorber and protects the detector from destruction at least for the short time necessary to conduct the test, whilst allowing sufficient penetration of the radiation to activate the lamp. Tests have shown that a detector designed to detect levels about 5 milliwatts/cm$^2$ at 2450 MHz may be left within a microwave oven for four minutes in a suitable container of water without causing any detrimental effect to the device. It was also discovered during experiments that moulding of the dipole or dipoles rigidly within the plastics block is severely detrimental to sensitivity of the detector if the dipoles are of a length suitable for operation in an air medium. This problem has been overcome by shortening the length of the dipoles such that they resonate properly in the new medium.

BRIEF DESCRIPTION OF THE DRAWINGS

In order that the invention may be more readily understood a particular embodiment will now be described with reference to the accompanying drawings wherein:

FIG. 1 is a plan view of a microwave leakage detector arrangement according to the invention;

FIG. 2 is an enlarged sectional view along the line 2—2 of FIG. 1;

FIG. 3 is a plan view of a microwave leakage detector arrangement according to a further embodiment of the invention;

FIG. 4 is a side view of the detector shown in FIG. 3 and

FIG. 5 is an underneath perspective view of the detector shown in FIG. 3.

DESCRIPTION OF THE PREFERRED EMBODIMENTS

As shown in the drawings the arrangement consists essentially of a mounting block or container generally referenced 10, having a head portion 11 and a handle portion 12. The mounting block 10 is moulded from a clear plastics material and a microwave detector 13 of a kind which is generally known per se is cast internally within the moulded mounting block 10. The detector 13 is shown schematically in FIG. 1 and consists essentially of a mounting board 14 onto which the necessary electrical or electronic components are mounted. The components include a LED 15 which is arranged to glow when microwave radiation above a predetermined level is received by the dipoles or antennae 16. A suitable printed circuit arrangement or wiring (not shown) is arranged on the opposite side of the board to interconnect the various components.

The dipoles or antennae 16 comprise suitable wires which are attached to the cirucitry on the mounting board 14. So as to preserve sensitivity of the device the dipoles 16 are arranged to have a length which is shorter than the length they would have in a medium consisting of air. The actual length is related to the type of material of the mounting block and is best determined by experiment.

The arrangement according to this embodiment may be constructed in many different ways and in the present case an initial layer of plastics material is poured into a suitable mould, the board 14 with components thereon is set into the first layer with the dipoles 16 attached thereto and then a second layer of plastics material is poured into the mould to cover the components and the plastic is allowed to set.

According to Australian standards, tests for leakage of domestic appliances must be conducted at a distance of five centimeters from any seals or joins at which leakage could occur. For convenience the device according to this embodiment is designed so that the dipoles 16 are arranged at a distance of five centimeters from the end 21 of the head portion 11. Thus the user may conveniently move the end 21 along any seals or joins whilst holding the device generally perpendicular to the surface in which case the measurement will be effected at the required distance.

In accordance with a further more preferred method of construction shown in FIGS. 3, 4 and 5 of the drawings the mounting block or container 10 is moulded in a form having head and handle portions generally as described above except that a cavity 17 is moulded within the container and is accessible from one side thereof. The electrical or electronic components are arranged on a suitable board 14 and connected together as before but in addition the entire arrangement of the circuitry and the dipoles is moulded within a solid block 18 of epoxy resin or the like in a manner whereby said LED 15 is visible externally therefrom. The cavity 17 in said container is shaped complimentary to the shape of the solid block 18 and thus the block may be placed in the cavity to fit snugly therein. Once the block is in the cavity a piece of similar plastics material (not shown) is welded to the container to cover the cavity and fully enclose the components therein in a manner whereby the LED 15 may be viewed externally of the container.

It is also possible according to the aforementioned arrangements to have the dipoles arranged in suitable tubular cavities (not shown) within the block or container such that the dipoles are diposed in a medium of air rather than being rigidly moulded within the plastics or like material of the container. Such an arrangement is not as desirable because the resonant frequency of the dipoles in air requires longer dipoles and consequently the size of the apparatus is larger. By mounting or arranging the dipoles rigidly within the plastics material the length of each dipole is reduced by about 2 cm. For detecting levels of about 5 milliwatts/cm$^2$ at 2450 MHz dipoles of approximately 1.8 cm in length are appropriate when moulded rigidly within a clear plastics material.

It should be apparent from the above that the present invention provides an improved detector arrangement which is most convenient in use and which may be readily tested in the domestic environment. In order to test the device it may be merely placed in a suitable container of water, within a microwave oven for example, so that the LED 15 may be viewed from outside. By turning the oven on the radiation level inside the oven, is far in excess of the usual leakage levels experienced but is considerably absorbed by the water so as to prevent damage to the arrangement whilst still providing sufficient energy to illuminate the lamp. There should be about 2.5 cm of water surrounding the device. Once the user is satisfied that the device is operating correctly it may be removed and used to conduct a leakage test. In the device described when it is arranged to detect the aforementioned level of radiation a voltage of 5.5 volts should not cause illumination of lamp 15 when applied to the circuit whereas a voltage of about 6.5 volts should cause such illumination. The clear plastics mounting block 10 also provides other advantages in packaging the device as it is conceivable that suitable inscription could be permanently placed inside the block during the moulding process with instructions on how to use the device, etc. Coloured layers of plastics material could also be used to give a greater visibility of the unit, a greater visibility of the signal and artistic appeal.

Clearly the arrangement could take many other shapes to that described above and it is only essential that the arrangement be designed to sink when placed in water. The arrangement may also be adapted to detect other similar forms of electromagnetic radiation besides microwave radiation.

What is claimed is:

1. A microwave detector arrangement comprising electrical circuitry having one or more dipoles connected thereto for receiving wave propagated electromagnetic energy such as microwave energy and providing a signal to said electrical circuitry related to the level of said energy, said circuitry being adapted to operate an associated visual warning device when said level exceeds a predetermined maximum level, said circuitry being fully encased in a substantially solid block of material in a manner whereby said warning device is externally visible and said block having a specific gravity greater than that of water such that said arrangement is caused to sink when placed in water.

2. An arrangement according to claim 1 wherein said circuitry and said warning device are moulded rigidly within said solid block.

3. An arrangement according to claim 2 wherein said one or more dipoles is/are moulded rigidly within said solid block.

4. An arrangement according to claim 1 wherein said electrical circuitry is moulded within a further solid block, which further solid block is arranged to fit snugly within a cavity arranged in said first mentioned block in a manner whereby a cover may be welded over said cavity to fully enclose said further solid block therein.

5. A method of producing a microwave detector arrangement comprising the steps of forming an electrical circuit adapted to receive a signal from associated dipole or dipoles connected thereto in response to said dipole/s receiving wave propagated electromagnetic energy, said circuit being connected to operate an associated visual warning device when the level of said energy exceeds a predetermined maximum level, moulding said circuit within a solid block, forming a container for said block, said container comprising a substantially solid body formed by a moulding process and having a cavity therein to receive said solid block and said dipole/s, placing said solid block and said dipole/s snugly within said cavity, placing a cover over said cavity and welding said cover to said body so as to fully enclose said solid block and dipoles within said cavity in a manner whereby said visual warning device is visible externally of said body, said arrangement having a specific gravity greater than that of water whereby it is caused to sink when placed in water.

6. A method according to claim 5 wherein said body is moulded from a clear plastics material and said visual warning device is a LED which is mounted within said cavity and externally of said solid block.

7. A method according to claim 6 wherein said body comprises a head portion in which said solid block and dipole/s are located and a handle portion depending from and formed integral with said head portion, said head portion having a nose part arranged on the opposite side thereof to said handle portion and said dipole/s being spaced a predetermined distance from said nose part and positioned such that, in use, said nose part may be placed against a seal or joint or the like of an appliance under test and said predetermined distance is the specified distance at which tests are to be made.

* * * * *